United States Patent [19]

Percival et al.

[11] Patent Number: 4,691,434

[45] Date of Patent: Sep. 8, 1987

[54] METHOD OF MAKING ELECTRICALLY CONDUCTIVE REGIONS IN MONOLITHIC SEMICONDUCTOR DEVICES AS APPLIED TO A SEMICONDUCTOR DEVICE

[75] Inventors: Richard Percival, Au/Zh; Ernst Uhlmann, Stettfurt, both of Switzerland

[73] Assignee: Lasarray Holding AG, Thundorf, Switzerland

[21] Appl. No.: 463,817

[22] Filed: Feb. 4, 1983

[30] Foreign Application Priority Data

Feb. 19, 1982 [CH] Switzerland .................... 1036/82

[51] Int. Cl.[4] ............................................. H01L 21/44
[52] U.S. Cl. ........................... 437/173; 148/DIG. 46; 148/DIG. 93; 357/24; 437/188; 437/51
[58] Field of Search .................... 29/591, 578, 576 B, 29/577 C; 148/1.5, DIG. 46, DIG. 93; 156/651, 643; 219/121 EJ, 121 EK, 121 LH, 121 LJ; 427/88, 91; 357/24; 430/22, 945

[56] References Cited

U.S. PATENT DOCUMENTS

| 4,037,075 | 7/1977 | Pugsley et al. | 219/121 LM |
|---|---|---|---|
| 4,181,563 | 1/1980 | Miyaka et al. | 219/121 LJ |
| 4,193,687 | 3/1980 | Reekstin et al. | 29/578 |
| 4,207,585 | 6/1980 | Rao | 29/578 |
| 4,231,149 | 11/1980 | Chapman et al. | 29/578 |
| 4,243,866 | 1/1981 | Pfeiffer et al. | 219/121 EJ |
| 4,301,191 | 11/1981 | Peek | 427/88 |
| 4,352,005 | 9/1982 | Evans et al. | 219/121 LJ |
| 4,400,797 | 8/1983 | Iwanami | 357/22 |
| 4,493,666 | 1/1985 | Nonomura et al. | 219/121 EK |

FOREIGN PATENT DOCUMENTS

WO81/930  4/1981  PCT Int'l Appl. .......... 219/121 EK

OTHER PUBLICATIONS

Percival et al., "Designing a Laser-Personalized Gate Array", VLSI Design, Feb. 1984, pp. 54–61.
Colclaser, *Microelectronics: Processing and Device Design,* John Wiley & Sons, New York, 1980, pp. 22–52 and 101–116.
Bhagat et al., "Contact Hole Formation in IC Using Ion Beam Nitriding", J. Electro. Chem. Soc., vol. 130, No. 11, Nov. 83.
Bhattacharyya et al., "Generators of Vias in Polyimide by Rapid Heating and Controlled Evaporation of the Underlying Metallurgy W/Palsed Laser", IBM Tech. Discl. Bul., vol. 24, No. 11A, Apr. 82.

*Primary Examiner*—Olik Chaudhuri
*Attorney, Agent, or Firm*—Werner W. Kleeman

[57] ABSTRACT

In the manufacture of semi-custom integrated circuits silicon wafers with P and N or N and P structures are used, and interconnections to establish a specific application must be created. Unlike currently known technologies, electrically conductive film with standardized openings made according to a pre-arranged raster must be deposited on the silicon wafer. Subsequently the conductive film, will be removed from between the openings directly or indirectly by means of electromagnetic radiation in order to produce the required circuit configuration. A laser beam is particularly appropriate for this since it can be positioned and controlled, and can be used directly for the exposure of a photosensitive film. The creation of insular conductive film is then achieved through a photo- etch technique. By use of this process, an expensive customer specific photo mask can be avoided. A semiconductor device manufactured according to this process exhibits in its conductive film a regular arrangement of openings which are able to form the ends, sides or corners of insular conductive film.

10 Claims, 6 Drawing Figures

METHOD OF MAKING ELECTRICALLY CONDUCTIVE REGIONS IN MONOLITHIC SEMICONDUCTOR DEVICES AS APPLIED TO A SEMICONDUCTOR DEVICE

BACKGROUND OF THE INVENTION

The present invention relates to a new and improved method of manufacturing monolithic integrated semiconductor devices and improved semiconductor devices manufactured according to the inventive method.

In the manufacture of customer specified integrated circuits, particularly in small and medium quantities, a pre-fabricated silicon wafer is used, distinguished by a multiplicity of P and N (or N and P) structures with contacts through a silicon-oxide layer; and an aluminium electrically conductive film thereon, forming electrical connections between the said P and N structures. The connection between contact surface and aluminium film occurs via so-called contact windows in the oxide layer which are arranged more or less regularly, and are visible in the aluminium film, and whose area forms a complete or partial conductive link (a so-called ohmic contact) with the contact surface.

It is well-known that the specialist, making use of electrical connections between the individual contact surfaces (in the XY plane), can create logical or linear circuits.

The required conductive areas are created through use of a well-known photo-etch technique, which requires a relatively expensive photo mask.

This known technique requires a relatively large expenditure, in that the photomask must be specially manufactured for each and every application.

SUMMARY OF THE INVENTION

It is an important object of the invention to realise an inexpensive and quick technique for the manufacture of integrated circuits.

A further important object is directed to a new and improved method of manufacturing integrated circuits without the use of special and expensive photomasks, and to integrated circuits manufactured by the inventive method.

These objects are solved through this invention. In a preliminary process step a series of regularly spaced openings is formed in the electrically conductive film and the spacing of the openings is similar or equal to the minimum width of a conductor. In a second process step the conductive film lying along the lines between the openings is removed progressively, until an insular conductive area is formed.

In terms of a semiconductor device, the task is solved in that the electrically conductive layer contains a pre-arranged raster or grid of openings, and these openings are the sides, ends or corners of insular conductive areas containing and making connection to underlying semiconductor devices.

BRIEF DESCRIPTIONS OF THE DRAWINGS

The invention will be better understood and objects other than those set forth above, will become apparent when consideration is given to the following detailed description thereof. Such description makes reference to the annexed drawings wherein.

DESCRIPTION OF THE PREFERRED EMBODIMENTS

Figure 1:
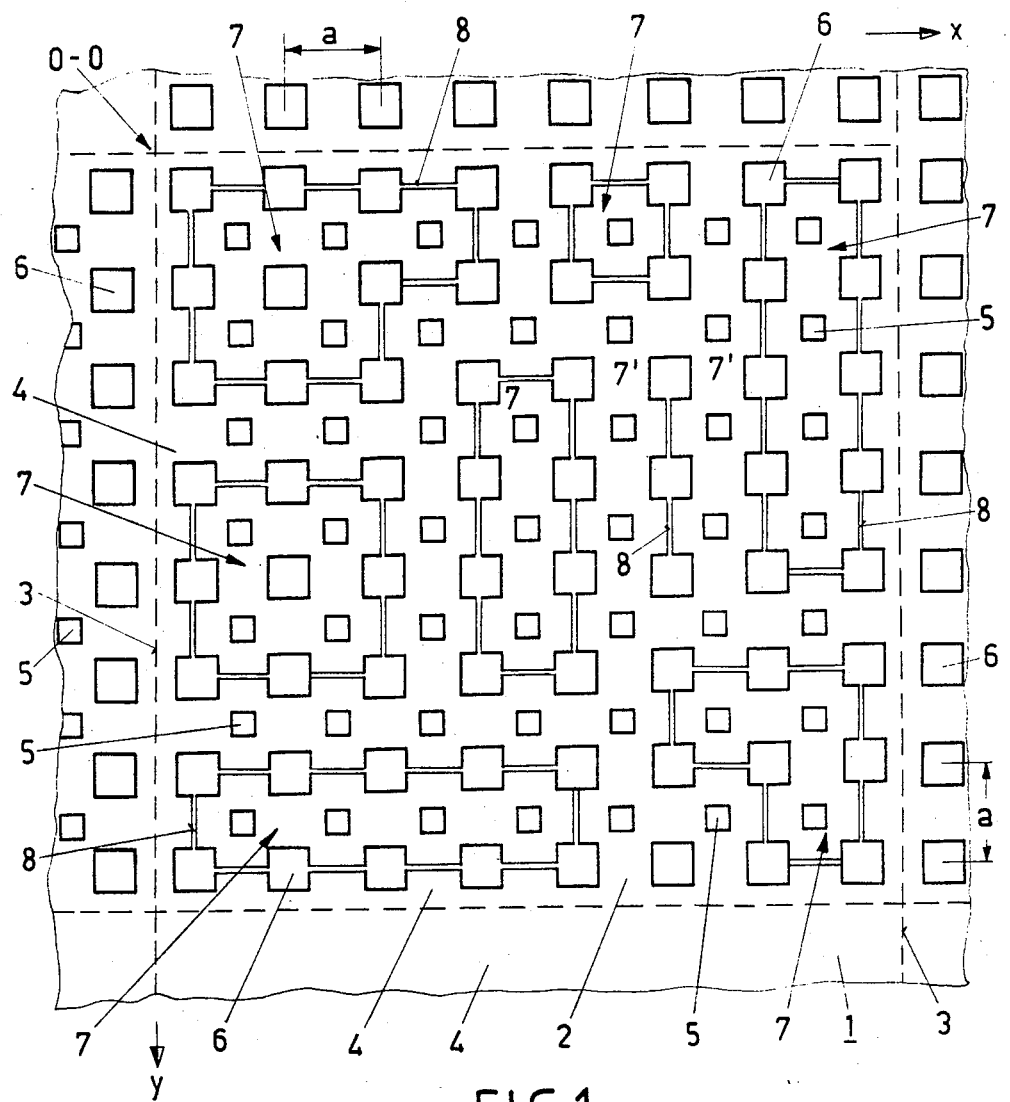
FIG. 1 is a simplified top plan view of a silicon wafer comprising dice bordered by dotted lines wherein to simplify the drawings the bonding pads have not been shown along the edges.

In FIG. 1 reference numeral 1 refers to a prefabricated silicon wafer, with P and N or N and P structures. Thereupon is seen the schematic representation of a single die (chip) with the separation points shown by dotted lines.

On the silicon wafer 1, a conductive film 4 of aluminium has been evaporated and deposited from the thus formed vapor in a conventional manner upon an insulating layer.

The film or layer 4 is connected to the contact surfaces 5 of the aforementioned structures.

The conductive layer 4 has a series of regularly spaced openings 6, forming isolated areas. The openings 6 are created by conventional photo etching technique, using a standard mask and have a raster pitch a.

By removing the conductive film 4 in straight lines 8 between a preselected number of regularly spaced openings 6, isolated conductive areas 7, 7' are formed, which are connected as appropriate to remote contact points.

A laser trimmer machine (e.g. Model 40 or 80 from ESI Inc., Portland/Oreg., USA) is suitable for the purpose of removing conductive film 4 in straight lines. Starting from a reference point, shown as 0,0, the laser beam scans the surface of the silicon wafer 1. Following a control program the laser beam scans the horizontal plane surface of the chip first in the x-direction, then in the y-direction. The scan lines are separated by the pitch a. At the same time the laser-beam is intermittently switched on and off, causing a removal, marking, or exposure of the chip surface as required by, and according to, the control program.

Depending on the technique selected, the machine applied makes use of a continuous-wave laser of greater or lesser power. A high powered laser is used to actually melt or evaporate the conductive film 4, and must be precisely calibrated for a particular film. A low powered laser (for instance Scientific Air-Cooled Argon Ion Laser model 162 A, from Spectra Physics, Santa Clara, Calif., USA), may be used compatibly with the standard photo-etch technique used for the making of the openings 6, either in the same or in a separate operation.

The technique described has the advantage that the applied beam can in practice be guided with the aid of the openings 6 allowing the conductive areas 7, 7' to be made especially simply and without the appearance of errors. Positioning and angular errors are tolerable within wide limits, without putting product quality at risk.

The electrically conductive areas may be achieved by the following methods there being given hereinafter a number of illustrative Examples.

EXAMPLE 1

The silicon wafer to be processed is coated with positive or negative photo resist, and then exposed via a standard mask possessing windows (for positive) or features (for negative, respectively), corresponding to the size of the required openings. After exposure and development and etching, metal film is removed to form the openings. After stripping the wafer may be stored.

To create a specific integrated circuit the wafer is coated with positive photo resist (for instance microposit 23 by Shipley Company Inc., Mass.; USA), exposed via the laser machine as required to allow removal of the photoresist along the straight lines; the conductive film may then be etched away, and the photoresist is stripped.

EXAMPLE 2

The wafer is coated with positive resist, exposed through the standard window-mask, developed, etched and stored in a lightproof container.

At the appropriate time it is exposed using the laser beam, developed again, and the straight-line cuts etched away and the photoresist is stripped.

EXAMPLE 3

The wafer is coated with positive photoresist, exposed through the standard window-mask, and stored in a light-proof container. After exposure with the laser beam the resist is developed; the exposed conducting surface of the wafer is then etched, and the remaining resist is stripped.

EXAMPLE 4

The silicon wafer is coated with positive resist and exposed through the standard window-mask. The photoresist is developed, and the wafer is stored in a light-proof container.

After exposure with the laser beam, the resist is again developed.

The the exposed conducting surface is etched, and the remaining resist stripped.

The selection of the most appropriate method is dictated by the type of laser machine and its control, and by the planned storage-time of the silicon wafers.

The manufacture of the openings 6, and of the straight-lines 8 can however use other known additive, i.e. material deposition or subtractive, material removal processes, for example: laser-assisted chemical vapor deposition using photo-excitation, photo-dissociation or local heating, as the laser-assisted processes, and laser-assisted etching, for example through the activation of gaseous chlorine etchant by laser light.

In a practically realised equipment, the coordinate table from a wafer and substrate cutting machine (Model 8002 by ESEC, Hünenberg, Switzerland) is used to produce the x and y movements in a wafer, while the light from the cw laser beam is modulated by an electro-optical shutter (Coherent Associates, Danbury, Conn., USA) all under control of a special computer program.

Electron beams and electromagnetic radiation can be used instead of a laser-beam.

The technique described here, and the devices it produces, are mainly appropriate for logic circuits (logic arrays), applied as control systems, circuits for producing and distributing clock signals, scratch-pad memories, interfaces to keyboards and switches, buss controllers, signal distribution, handshaking, and output stages for LED and LCD displays.

This technology will be best exploited by implementing a library of standard logic functions based upon a primitive element (one P and one N channel transistor) known as a stage. By use of a computer program, construction of logic circuits directly from a truth-table or behavoral description is economically realisable. Data from the computer serves directly or indirectly to control the coordinate table and the laser beam.

As the following example shows, however, analog charge coupled devices can also be realised. A semiconductor device is shown in schematic cross section in FIG. 2, demonstrating the layered construction. In this case there is shown a so-called bucket-brigade-device constructed of transistors, whose sources are marked S, gates are marked G and drains are marked D, and where the conductive areas 7, 7' have the function of clock-lines. The structure shown with D and S is formed from two transistors.

In a n-doped silicon wafer 9 there are $p^+$ diffusions 10 whose contact areas are covered by a silicon dioxide insulating layer 11 over which a conductive aluminium layer 12 is deposited. For simplicity the conductive areas 7, 7' which are important for the definition of the function of the device are shown by lines.

Figure 2:
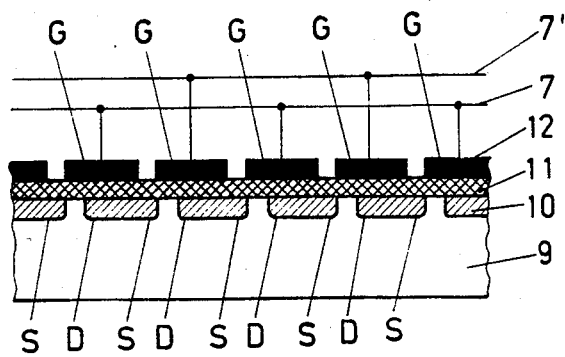
FIG. 2 is a fragmentary sectional view cut through a semiconductor device, in this example a charge-transfer device.
Figure 3:
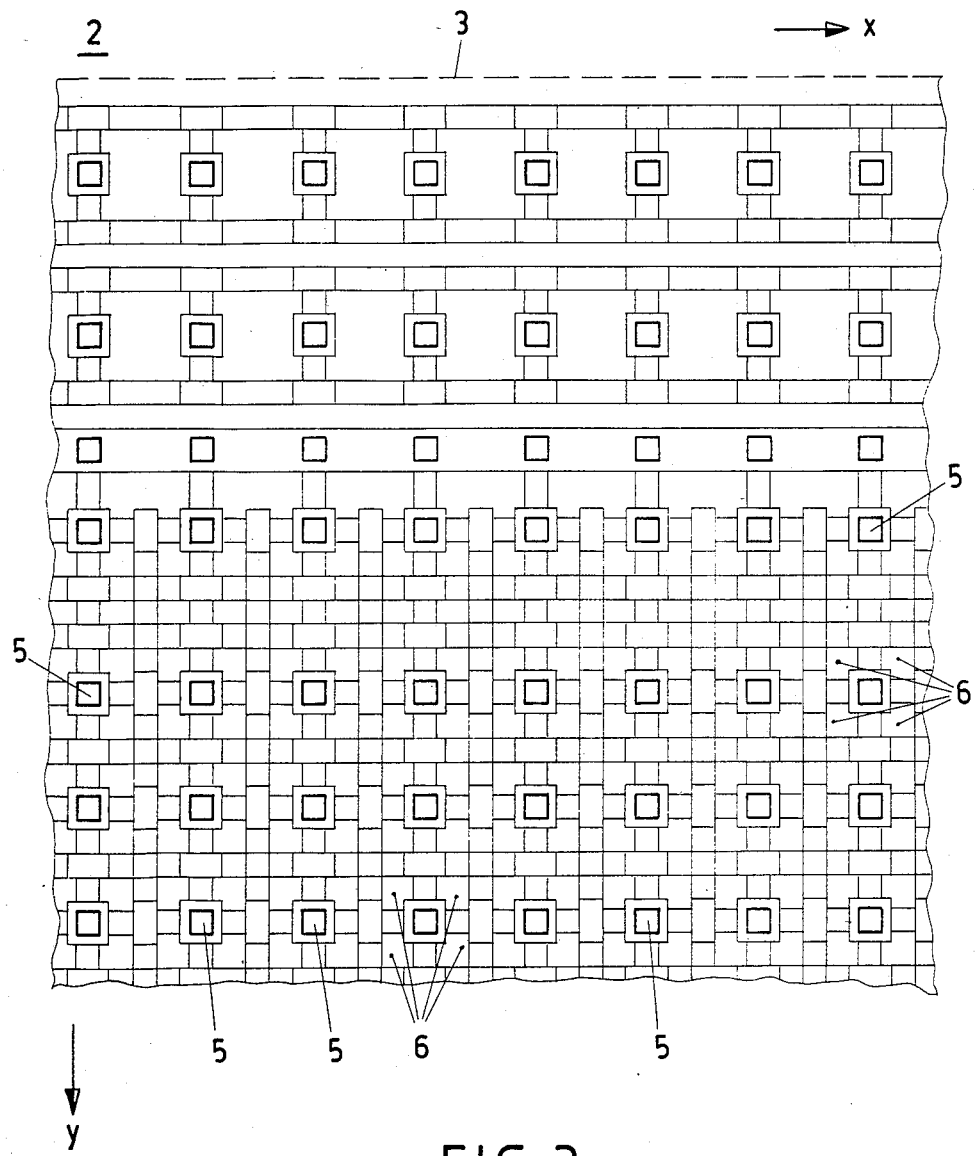
FIG. 3 is a plan view of the conductive film on part of a prefabricated silicon wafer, with transistors organized according to the showing of FIG. 2.

To manufacture the semiconductor device of FIG. 2 a prefabricated silicon wafer with a standard raster as shown in FIG. 3 is used. The edges of a single die are shown by the dotted line indicating the separating points 3. The heavy squares represent the contact areas 5 in the aluminium film or layer 12 of FIG. 2, where electrical contact is made with the underlying structures 9, 10. Openings 6, of for instance six-sided form surround the contact areas or surfaces 5 and form an appropriate regular raster pattern.

This prefabricated silicon wafer contains an underlying series of semiconductor layers (see FIG. 6) and can be used to produce bucket-brigade-devices of any length by means of straight line cuts in the aluminium layer 12 in the x and y directions.

Figure 4:
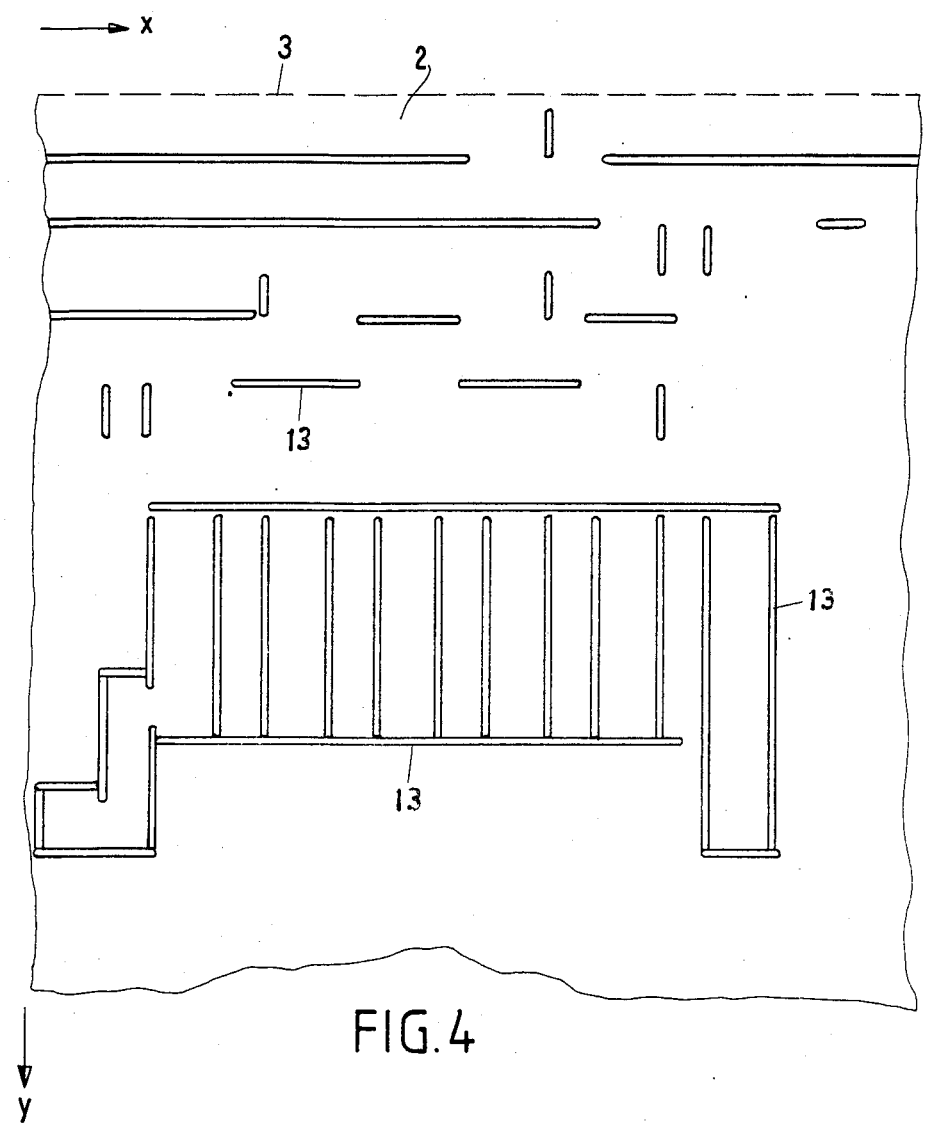
FIG. 4 is a schematic representation demonstrating how the removal of conductive film in straight lines will result in the creation of a circuit as shown in FIG. 2 on part of the silicon wafer.

This is shown in FIG. 4 where the required cutting pattern is shown by reference character 13. In the actual model a positive photo-resist (Microposit 23) on the wafer surface is exposed by the 458 nm wavelength beam from a CW-laser operating at an output power of 0.2 mW and a scanning speed of 25 cm/sec.

The argon ion laser beam is aimed at the center of the openings or windows 6 and switched on or off according to the position, and the control program.

It is obvious that the roles of beam and coordinate table could be reversed so that an identical cutting pattern would be achieved holding the wafer fixed and controlling the movement of the laser beam.

Figure 5:
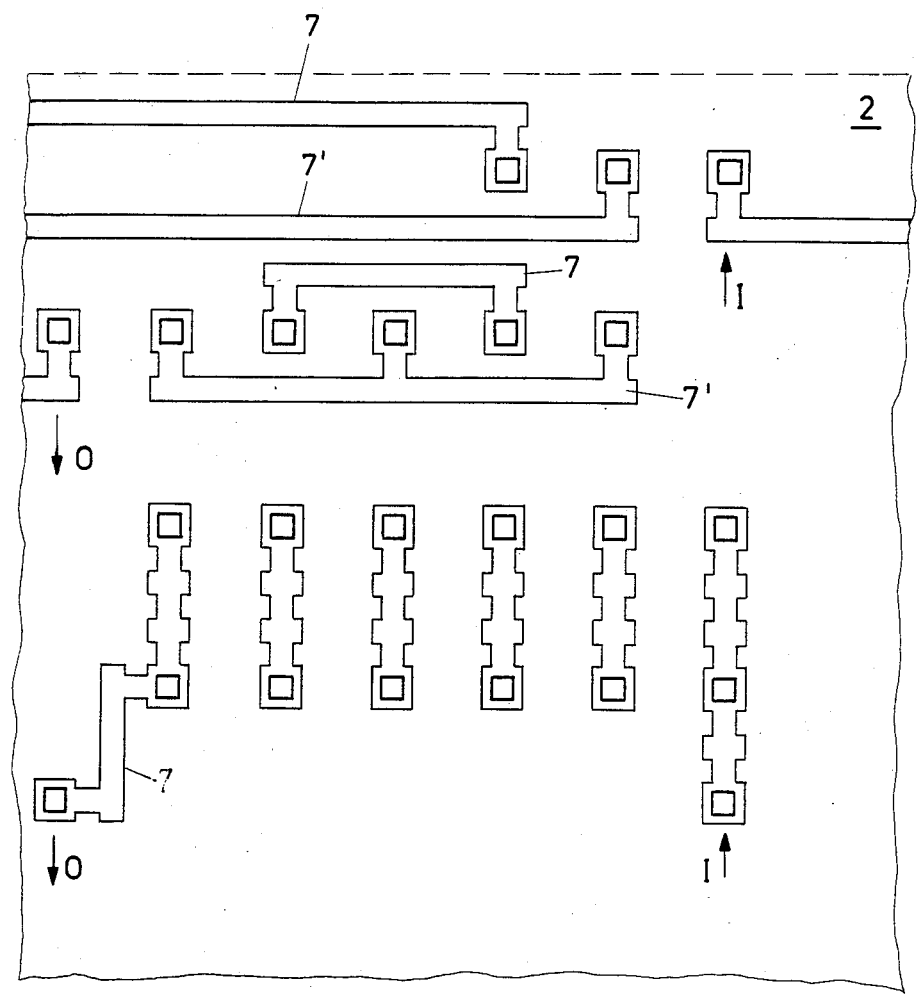
FIG. 5 illustrates the same part of the wafer after removal of the film in straight lines.

The finished circuit (FIG. 2) is shown in FIG. 5. The conductive areas are again indicated by 7, 7'. The inputs to the circuit are shown as I, the outputs as O.

Figure 6:
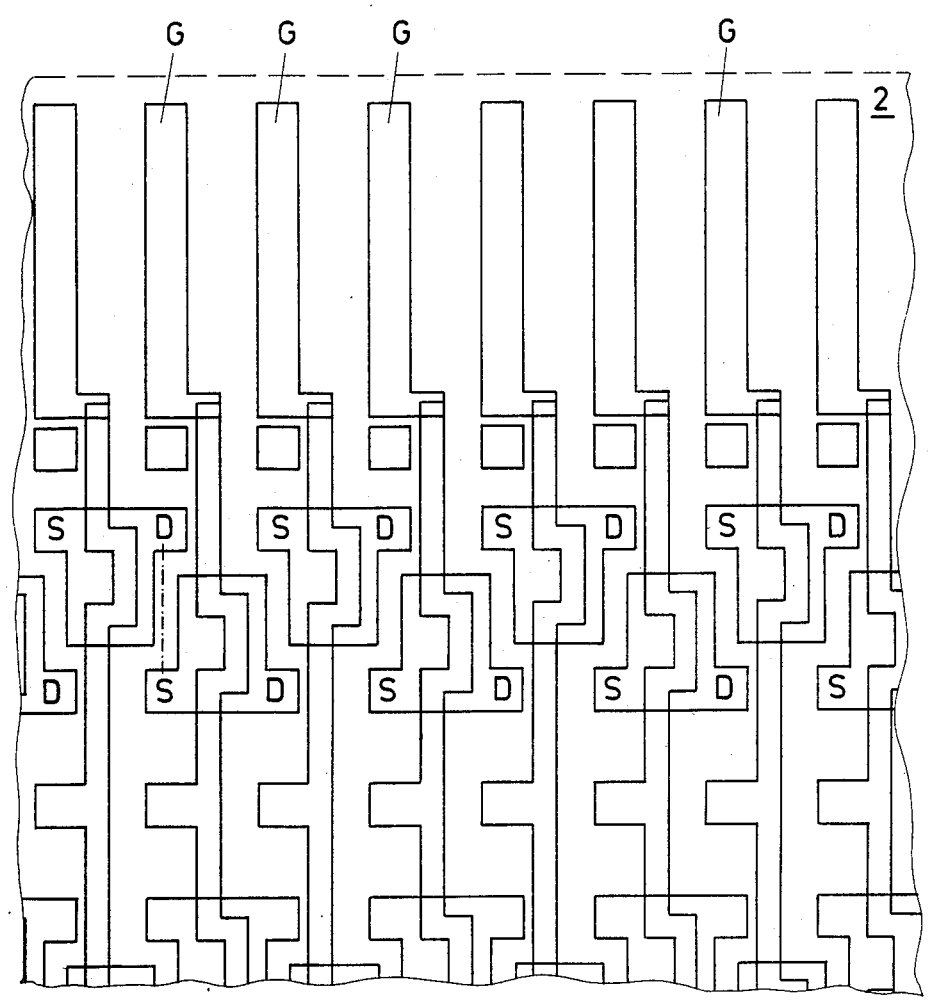
FIG. 6 illustrates the underlying transistors in the same area as shown in FIGS. 3 to 5, forming the circuit of FIG. 2.

For completeness, transistors in simplified form are shown as diffusion layers in FIG. 6. Source is shown as S, and gate is shown as G, to conform with FIG. 2. The necessary metallic connection between two neighbouring transistors is shown symbolically by means of a dotted line.

As this example illustrates the entire function of an integrated circuit can, in a simple fashion, be created from standardised chips possessing standardised openings. The techniques described above can also be used where there is a requirement for several levels of electrically conductive film.

While there are shown and described present preferred embodiments of the invention, it is to be distinctly understood that the invention is not limited thereto, but may be otherwise variously embodied and practiced within the scope of the following claims. Accordingly,

What I claim is:

1. A method of processing a prefabricated semiconductor wafer having a multiplicity of P and N structures containing at least in part regularly recurring contact surfaces on said structures, a covering insulating layer at the level of the contact surfaces and pieced at predetermined intervals, and a conductive film applied to the covering insulating layer and at least partially connected with said contact surfaces, said method comprising the steps of:

forming in said conductive film a plurality of at least in part regularly repeated openings;

during said step of forming said plurality of openings in said conductive film, forming said openings at predetermined spacings relative to each other;

after said step of forming said plurality of openings in said conductive film, removing parts of said conductive film along predetermined lines extending in two mutually substantially perpendicular directions and linking a preselected number of said openings in order to thereby obtain insular conductive areas which have a predetermined width and each of which constitutes a monolithic integrated semiconductor device; and said step of forming said pluarlity of openings in said conductive film at predetermined spacings from each other, entailing the step of spacing said openings by an amount which corresponds to said predetermined width of said insular conductive areas.

2. The method as defined in claim 1, wherein:

said step of removing parts of said conductive film along said predetermined lines entails removing said parts of said conductive film along substantially straight lines.

3. The method as defined in claim 2, further including the step of:

using a laser beam for removing said parts of said conductive film along said substantially straight lines.

4. The method as defined in claim 3, further including the steps of:

applying a photosensitive film to said conductive film;

said step of using said laser beam including the step of exposing said photosensitive film to said laser beam at predetermined locations corresponding to said substantially straight lines;

developing said photosensitive film; and said step of removing said parts of said conductive film along said substantially straight lines entails etching away parts of said conductive film which have become etchable after exposing and developing said photosensitive film.

5. The method as defined in claim 3, wherein:

said step of using said laser beam entails melting or evaporating said conductive film along said substantially straight lines.

6. The method as defined in claim 2, further including the step of:

using an electron beam for removing said parts of said conductive film along said substantially straight lines.

7. The method as defined in claim 2, further including the step of:

using an electromagnetic ray for removing said parts of said conductive film along said substantially straight lines.

8. The method as defined in claim 1, wherein:

said step of forming said plurality of openings entails forming said openings by an additive process.

9. The method as defined in claim 1, wherein:

said step of forming said plurality of openings entails forming said openings by a subtractive process.

10. A method of patterning a conductive film on and, at least, partially connected to a semiconductor substrate for use in the fabrication of monolithic integrated semiconductor devices, comprising the steps of:

forming in said conductive film a plurality of at least in part regularly repeated openings;

during said step of forming said plurality of openings in said conductive film, forming said openings at predetermined locations;

subsequent to the formation of said plurality of openings in said conductive film, removing parts of said conductive film along predetermined lines linking a preselected number of said openings in said conductive film in order to thereby obtain insular conductive areas of predetermined dimensions constituting the conductive parts of monolithic integrated semiconductor devices; and said step of forming said plurality of openings in said conductive film at said predetermined locations entailing the step of forming said openings at locations which correspond to the predetermined dimensions of said insular conductive areas.

* * * * *